(12) United States Patent
Baldridge et al.

(10) Patent No.: US 9,082,936 B2
(45) Date of Patent: Jul. 14, 2015

(54) TRANSPARENT LED LAMP FOR BIDIRECTIONAL LIGHTING

(71) Applicant: Nthdegree Technologies Worldwide Inc., Tempe, AZ (US)

(72) Inventors: Jeff Baldridge, Chandler, AZ (US); Mark David Lowenthal, Gilbert, AZ (US); Bradley Steven Oraw, Chandler, AZ (US); Thomas Frederick Soules, Livermore, CA (US)

(73) Assignee: Nthdegree Technologies Worldwide Inc., Tempe, AZ (US)

( * ) Notice: Subject to any disclaimer, the term of this patent is extended or adjusted under 35 U.S.C. 154(b) by 0 days.

(21) Appl. No.: 14/162,116

(22) Filed: Jan. 23, 2014

(65) Prior Publication Data

US 2014/0209945 A1   Jul. 31, 2014

Related U.S. Application Data

(60) Provisional application No. 61/757,783, filed on Jan. 29, 2013.

(51) Int. Cl.
*H01L 33/38* (2010.01)
*H01L 27/15* (2006.01)
*H01L 25/075* (2006.01)

(52) U.S. Cl.
CPC ............ *H01L 33/38* (2013.01); *H01L 25/0753* (2013.01); *H01L 27/153* (2013.01)

(58) Field of Classification Search
CPC combination set(s) only.
See application file for complete search history.

(56) References Cited

U.S. PATENT DOCUMENTS

| | | | | |
|---|---|---|---|---|
| 7,622,367 B1 * | 11/2009 | Nuzzo et al. | | 438/472 |
| 2005/0212406 A1 * | 9/2005 | Daniels et al. | | 313/503 |
| 2007/0057624 A1 * | 3/2007 | Angelopoulos et al. | | 313/503 |
| 2009/0114928 A1 * | 5/2009 | Messere et al. | | 257/88 |
| 2011/0163681 A1 * | 7/2011 | Dau et al. | | 315/191 |
| 2012/0268932 A1 * | 10/2012 | Lerman et al. | | 362/235 |

* cited by examiner

*Primary Examiner* — Khaja Ahmad
(74) *Attorney, Agent, or Firm* — Patent Law Group LLP; Brian D. Ogonowksy

(57) ABSTRACT

A flexible light sheet includes a thin substrate that allows light to pass through it, a transparent first conductor layer overlying the substrate, an array of vertical light emitting diodes (VLEDs) printed as an ink over the first conductor layer, each of the VLEDs having a bottom electrode electrically contacting the first conductor layer, a dielectric material between the VLEDs overlying the first conductor layer, and a transparent second conductor layer overlying the VLEDs and dielectric layer, each of the VLEDs having a top electrode electrically contacting the transparent second conductor layer. Each individual VLED may emit light bidirectionally. The VLEDs are illuminated by a voltage differential between the first conductor layer and the second conductor layer such that bidirectional light passes through the first conductor layer and the second conductor layer. Phosphor layers may be deposited on both sides to create white light using blue VLEDs.

15 Claims, 3 Drawing Sheets

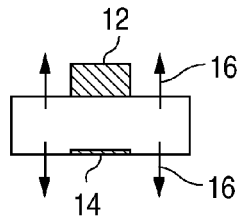
FIG. 1
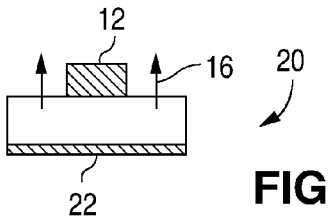
FIG. 2
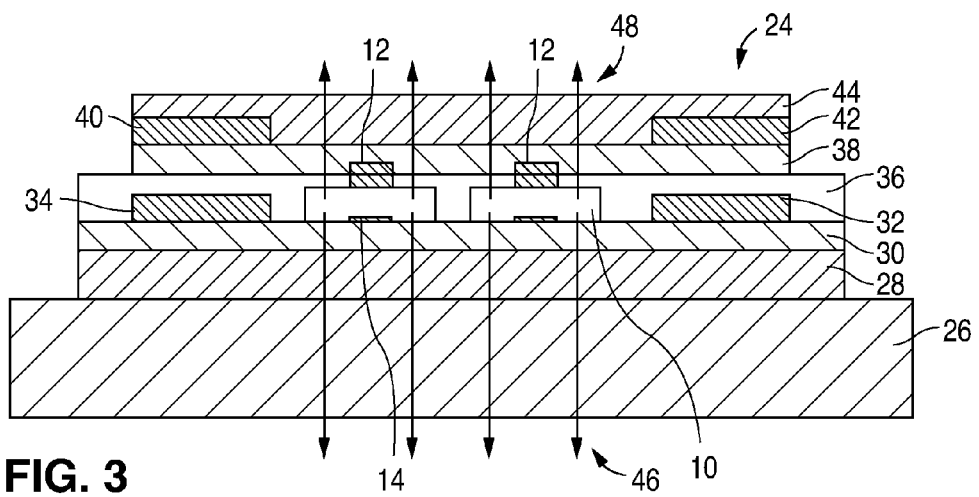
FIG. 3
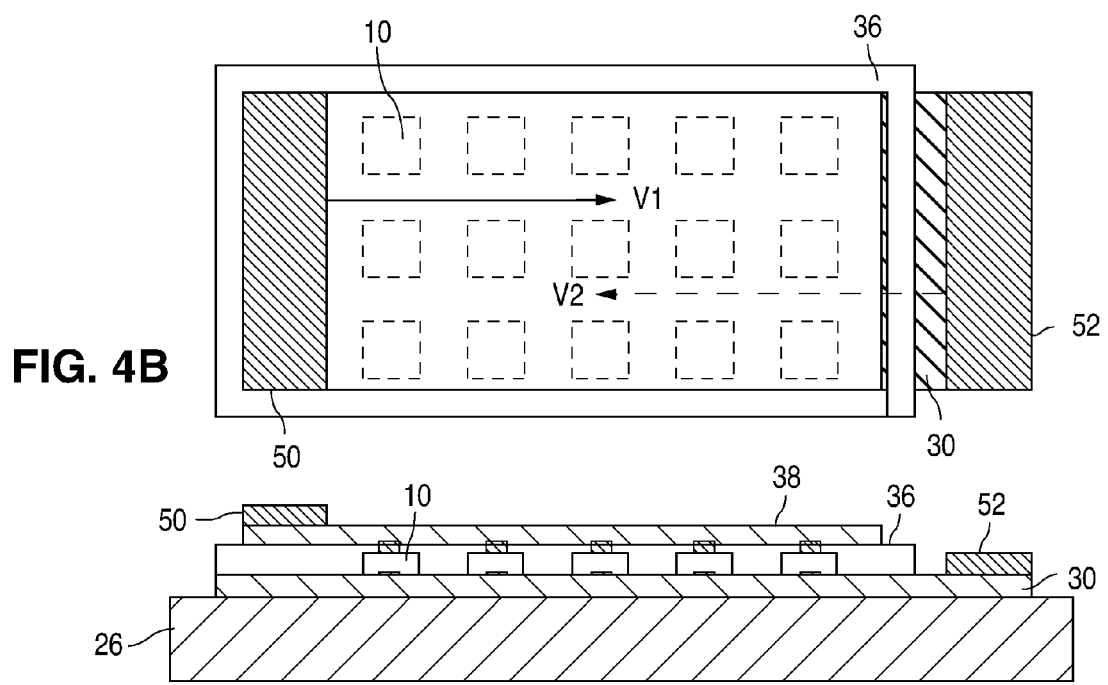
FIG. 4B
FIG. 4A

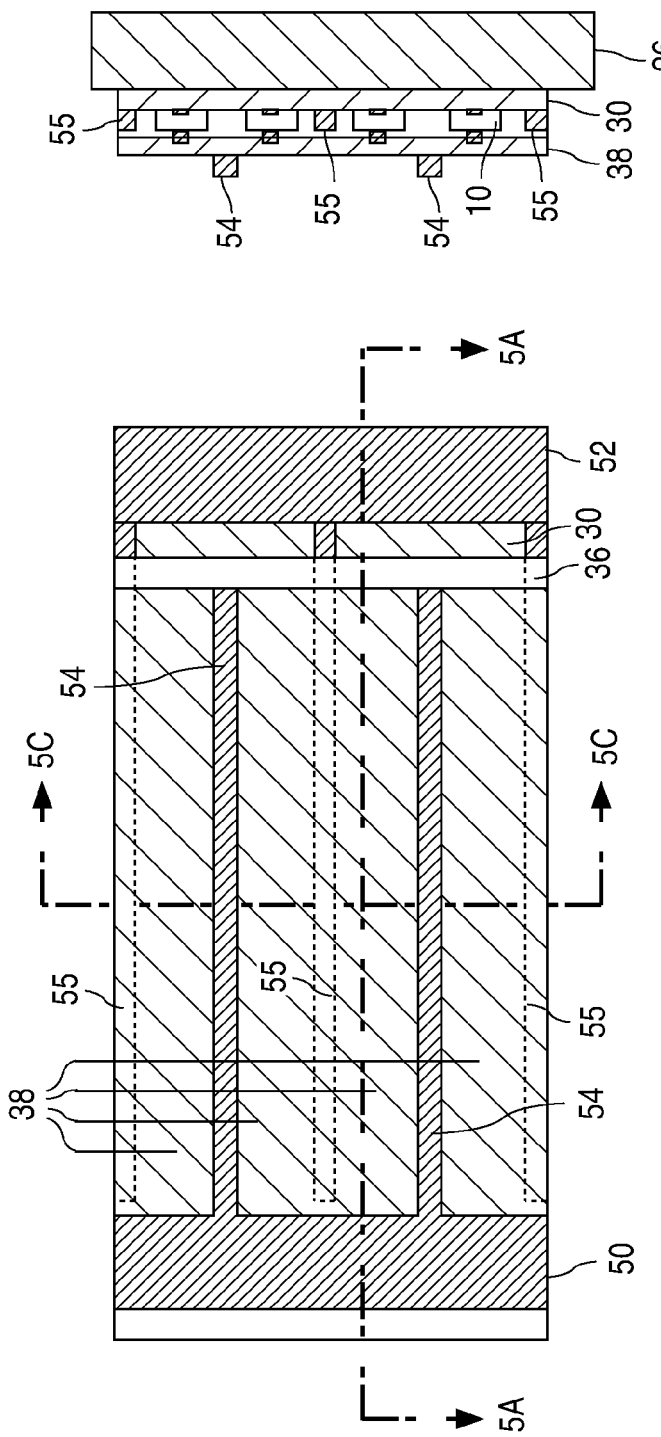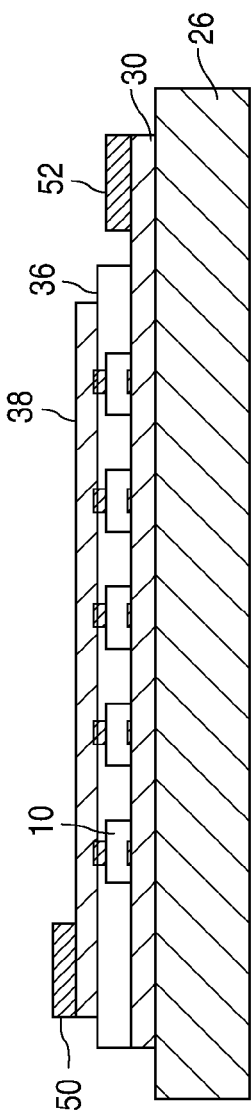

TRANSPARENT LED LAMP FOR BIDIRECTIONAL LIGHTING

CROSS-REFERENCE TO RELATED APPLICATIONS

This application is based on U.S. provisional application Ser. No. 61/757,783, filed Jan. 29, 2013, by Mark David Lowenthal et al., assigned to the present assignee and incorporated herein by reference.

FIELD OF THE INVENTION

This invention relates to forming a bidirectional lamp, formed generally as a flat sheet, using an array of vertical light emitting diodes (VLEDs).

BACKGROUND

Bidirectional light sheets formed using LEDs have various uses, such as for general lighting of a room. For example, the side facing downward can provide direct lighting, while the side facing toward the ceiling can provide diffused lighting and create an aesthetically pleasing appearance. Phosphors can be used with blue LEDs to create any colors, including white light. The light sheet may also be suspended vertically.

A common solid-state overhead lamp is formed by a flat plastic light guide having a roughened surface. High-power packaged LEDs, such as white light LEDs using a phosphor, are optically coupled to the edge(s) of the light guide, and the LED light is reflected internally by the light guide until it exits through the roughened surface. Such a technique produces uneven lighting across the light guide due to absorption by the light guide and the light leakage. If there is no reflector over the top surface of the light guide, the light will exit bidirectionally.

It is also known to distribute many identical medium-power bare LEDs over a first transparent substrate, having a conductor pattern, and bond the bottom LED electrodes to the conductor pattern. Then, a top transparent substrate with a similar conductor pattern is aligned with and laminated over LEDs. Then the top LED electrodes are then bonded to the top conductor pattern. The LEDs all have a reflective layer forming the cathode contact and have a small anode electrode to allow light to exit the anode surface. No light exits the cathode surface since it is completely covered by the reflective layer. If the LEDs are properly arranged with respect to the conductor patterns, and their orientations (anode up or anode down) are alternated, the LEDs may be connected in series by the conductor patterns and emit light through opposite surfaces of the light sheet. Phosphor may be deposited on the external surfaces of the substrates to select the desired emission color, such as white light. Problems with such a device when forming a wide area light sheet are that: 1) it is very difficult to align the LEDs with the conductor pattern; 2) it is very difficult to align the top substrate with the LEDs; 3) the pick-and-placement process is time-consuming; 4) the failure of an LED or its bond creates an open circuit in the series; 5) and, any bending of the light sheet will create a shearing force between the two substrate and delaminate one of the substrates. Such a bidirectional light sheet is disclosed in US Patent Application Publication No. US 2012/0268732.

Additionally, LEDs having a bottom reflective electrode used to redirect the 50% of light generated in the LED junction emitted toward the bottom of the device back toward the upper surface of the LED have significant optical losses at the mirror. Using typical conductive metal mirrors, it is difficult to achieve higher than 80% to 90% reflectivity at the mirror surface, with the rest lost to absorption, and in turn heat. Total internal reflection (TIR) is always a problem in the high refractive index materials used in LED devices, making light extraction structures such as roughening of the exterior surface of the LED a requirement. The presence of a metal mirror electrode exacerbates the TIR problem by introducing a surface which absorbs a portion of a totally internally reflected light ray at every bounce off the mirror.

What is needed is a solid-state bidirectional light sheet and fabrication technique that does not have the drawbacks of the prior art.

SUMMARY

In one embodiment, microscopic LEDs are infused in a solvent, including a viscosity-modifying polymer resin, to form an LED ink for printing, such as screen printing.

A transparent substrate has a transparent conductor layer, such as ITO, deposited on it.

The LEDs are then printed over the conductor layer. The shapes of the LEDs and the electrodes may be designed so that the LEDs orient themselves to a high degree with their anodes up or cathodes up, as desired, after the LEDs are printed and sink through the solvent onto a transparent substrate surface. This is useful for DC operation to maximize the number of printed LEDs that are operational with a single voltage polarity. Alternatively, the LEDs can be arbitrarily oriented on the substrate, which will result in about a 50/50 orientation, and all the LEDs can be energized by rapidly alternating the polarity of the driving voltage. Millions of microscopic LEDs can be printed on a single substrate.

In one embodiment, the LEDs have a small anode electrode and a small cathode electrode so light exits equally through both surfaces of the LEDs. Accordingly, there is no absorption by a reflective layer, and virtually no absorption by the LED semiconductor layers if appropriate light extraction structures are formed on the upper or lower surfaces of the LED or both surfaces of the LED to suppress TIR.

After the LEDs are printed, the solvent is heated to evaporate it. Pressure produced by the small amount of polymer forming the remaining dried film presses the LEDs against the underlying transparent conductor to form an ohmic contact with the transparent conductor.

There may be a phosphor layer between the substrate and the transparent conductor for converting the LED light to any color, such as white. The phosphor layer may comprise phosphor powder in a semi-resilient binder so it will not crack if bent.

A very thin dielectric layer is then deposited over the LEDs to encapsulate their sides and further secure them in place.

A second transparent conductor layer is then deposited over the surface of the LEDs to make ohmic contact to the top electrodes.

One or more edges of the transparent conductor layers have a metal bus bar extending along it to distribute the driving voltage along the edge(s) of the transparent conductive layer.

A top phosphor layer, which may be identical to the bottom phosphor layer, may then be deposited over the top conductor layer.

When a driving voltage is coupled to the bus bars on the two transparent conductor layers, the LEDs having the proper orientation will light up and energize the two opposing phosphor layers, since the light exits the LEDs from both sides.

If the LEDs do not have the same orientation, the voltage polarity may be rapidly reversed, such as at greater than 60 Hz, to energize all the LEDs. Flicker will not be perceived at greater than 60 Hz. Either a sinusoidal AC or square AC waveform may be used, with a square AC waveform being preferable for the maximum possible duty cycle and brightness.

Since a reflector layer is not used on the LEDs, and the bare LEDs are themselves bidirectional, there is no loss in efficiency due to the light emitted from the active region being reflected back into the LED.

Thus, all layers may be printed under atmospheric conditions to form a wide-area bidirectional light sheet. Since there is only one substrate, bending of the light sheet will not create any shearing stress between substrates, in contrast to the prior art. Further, the light sheet may be made thinner due to the smaller LEDs and only one substrate. In one embodiment, the substrate may even be removed, resulting in an even more flexible light sheet that can be laminated onto any other substrate, including fabric.

In another embodiment, the LEDs have a reflective electrode covering one surface and a small electrode on the other surface for allowing light to escape. To provide bidirectional lighting with only a single layer of LEDs and a single substrate, the LEDs are randomly oriented, resulting in about 50% facing upward and 50% facing downward. Otherwise, the structure is the same as that described above. The driving voltage to the top and bottom transparent conductor layers is then AC so that all the LEDs are illuminated at greater than 60 Hz to provide a bidirectional emission.

In one embodiment, a single metal bus bar is printed along one edge of the bottom transparent conductor layer, and a single metal bus bar is printed along the opposite edge of the top transparent conductor layer. There is some resistance in the transparent conductor layers, and the voltage applied to each bus bar is linearly reduced as the current spreads along the conductor layer. However, since the lowering of the driving voltage is in opposite directions along the opposing transparent conductor layers, and the opposing transparent conductor layers have the same impedance, the voltage difference normal to the conductor layers is the same over the entire area of the conductor layer. Therefore, all the LEDs will conduct approximately equal currents and have equal brightness.

Other embodiments are described.

BRIEF DESCRIPTION OF THE DRAWINGS

FIG. 1 is a simplified cross-section of a vertical LED designed to emit light from its top surface and bottom surface. The shape of the LED can be fluid-dynamically designed so that all the LEDs are oriented in the same direction on a transparent substrate when printing using an LED ink or, instead, can be designed to randomly orient with about half anode up and half anode down.

FIG. 2 is a simplified cross-section of a vertical LED designed to emit light from its top surface only, where the bottom surface electrode is a reflector that covers the entire bottom surface. The shape of the LED can be fluid-dynamically designed so that there is an equal probability of the reflective surface facing up or down on a transparent substrate when printing using an LED ink.

FIG. 3 is a cross-sectional view of a bidirectional light sheet, where the LEDs are bidirectional, as shown in FIG. 1, and greatly exaggerated in size.

FIG. 4A is a cross-sectional view of another embodiment of a bidirectional light sheet, where a metal bus is along one edge of each transparent conductor layer, and the metal buses are opposite each other for providing an equal differential voltage across each LED in the light sheet.

FIG. 4B is a top down view of the light sheet of FIG. 4A.

FIG. 5A is a cross-sectional view of another embodiment of a bidirectional light sheet, where narrow metal fingers (or runners) extend along each transparent conductor layer to equalize a voltage across the conductor layers. FIG. 5A is taken along line 5A-5A in FIG. 5B.

FIG. 5B is a top down view of the light sheet of FIG. 5A.

FIG. 5C is a cross-sectional view of the structure of FIG. 5B along line 5C-5C.

Elements that are similar or identical in the various figures are labeled with the same numeral.

DETAILED DESCRIPTION

Figure 6:
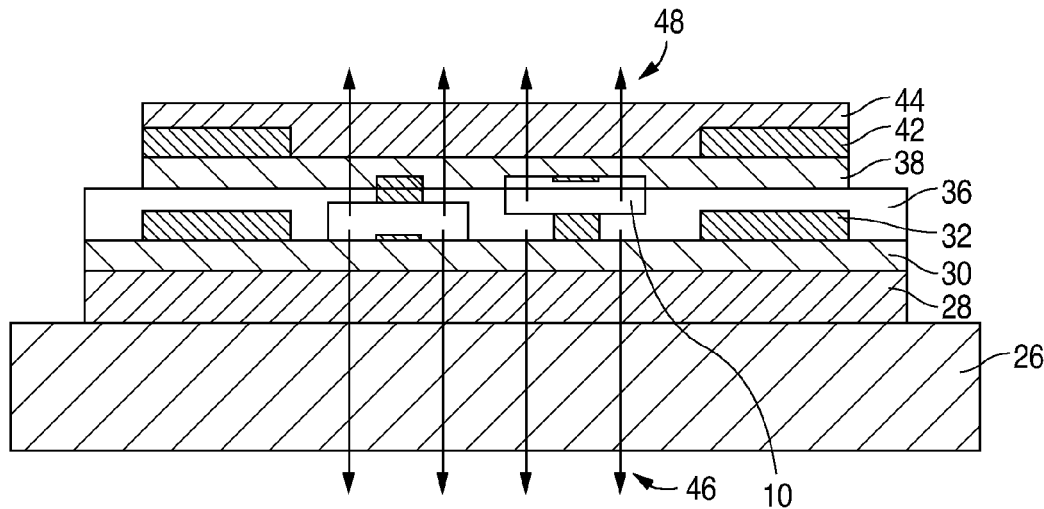
FIG. 6 is similar to FIG. 3 but the LEDs are arbitrarily oriented on the substrate and driven by an AC signal to energize all the LEDs over a full cycle.

The GaN-based micro-LEDs used in embodiments of the present invention are less than a third the diameter of a human hair and less than a tenth as high, rendering them essentially invisible to the naked eye when the LEDs are sparsely spread across a substrate to be illuminated. This attribute permits construction of a double-sided, nearly or partially transparent lamp made with micro-LEDs. The number of micro-LED devices per unit area may be freely adjusted when applying the micro-LEDs to the substrate. A well dispersed random distribution across the surface can produce nearly any desirable surface brightness. Lamps well in excess of 10,000 $cd/m^2$ have been demonstrated by the assignee. The LEDs may be printed as an ink using screen printing or other forms of printing. Further detail of forming a uni-directional light source by printing microscopic vertical LEDs, and controlling their orientation on a substrate, can be found in US application publication US 2012/0164796, entitled, Method of Manufacturing a Printable Composition of Liquid or Gel Suspension of Diodes, assigned to the present assignee and incorporated herein by reference.

FIG. 1 is a cross-sectional view of a vertical LED 10 (VLED) that may be used in the invention. The LED 10 includes standard semiconductor GaN layers, including an n-layer, and active layer, and a p-layer.

In one embodiment, an LED wafer, containing many thousands of vertical LEDs, is fabricated so that the metal anode electrode 12 for each LED is small to allow light to escape the anode side, and the metal cathode electrode 14 for each LED is also small to allow about the same amount of light to escape the cathode side. The anode and cathode surfaces may be opposite to those shown. The LEDs are completely formed on the wafer, including the anode and cathode metallizations, by using one or more carrier wafers during the processing and removing the growth substrate to gain access to both LED surfaces for metallization. After the LEDs are formed on the wafer, trenches are photolithographically defined and etched in the front surface of the wafer around each LED, to a depth equal to the bottom electrode, so that each LED has a diameter of about 30 microns and a thickness of about 7 microns. A preferred shape of each LED is hexagonal. The back surface of the wafer is then thinned until the LEDs are singulated. The LEDs of FIG. 1 or FIG. 2 result, depending on the metallization designs. The microscopic LEDs are then uniformly infused in a solvent, including a viscosity-modifying polymer resin, to form an LED ink for printing, such as screen printing, or flexographic printing.

The LEDs may instead be formed using many other techniques and may be either much larger or smaller. The lamps described herein may be constructed by techniques other than printing.

In FIG. 1, the electrodes 12 and 14 are reflective and only use up about 10% to 30% of the surface area of the LED 10. Even coverage up to 50% is adequate due to the reflectiveness of the electrodes 12 and 14. A transparent conductor layer over the anode and cathode semiconductor surfaces may be used to spread current from the metal electrodes.

Since there is no blockage of light around the electrodes 12 and 14, and the active layer emits light in both directions, light rays 16 are emitted bidirectionally in roughly equal proportions from both top and bottom surfaces of the bare LED dies. Optionally, the bottom electrode 14 may be completely omitted and replaced with a transparent conductor, such as ITO.

In other embodiments of a bidirectional light sheet, the LED 20 of FIG. 2 may be used, where the fabrication process is identical to that for the LED 10 of FIG. 1 but the reflective metal cathode electrode 22 (a mirror) fully covers the cathode surface. The anode and cathode surfaces may be reversed.

The surfaces of the LEDs 10 and 20 may be roughened by etching to increase light extraction (i.e., decrease internal reflections).

If it is desired for the anode electrodes 12 to be oriented in a direction opposite to the substrate after printing, the electrodes 12 are made tall so that the LEDs are rotated in the solvent, by fluid pressure, as they settle on the substrate surface. The LEDs rotate to an orientation of least resistance. Over 90% like orientation has been achieved, although satisfactory performance may be achieved with over 75% of the LEDs being in the same orientation. If an arbitrary orientation is desired for an approximate 50/50 orientation, the top and bottom electrodes should be nearly identical in form and size.

FIG. 3 illustrates a light sheet 24, or a repeated section of a light sheet, with the relative sizes of the LEDs 10 greatly exaggerated. The light sheet 24 may be any size, such as one square meter, containing millions of LEDs 10.

A transparent or semi-transparent starting substrate 26 is preferably as thin as practical for minimizing light absorption but providing suitable mechanical strength to the light sheet. The substrate 26 may be a suitable polymer, such as Mylar or PMMA, and may be dispensed from a roll. The transmissivity should be greater than 90%. The substrate 26 can be any size, such as one square meter across, since no vacuum processing is needed for fabrication, and the process may be performed using a conveyor system.

If wavelength conversion of the LED light is desired, a bottom phosphor layer 28 is deposited, such as by screen printing. If the LEDs 10 emit blue light, the phosphor layer 28 may be a combination of YAG (yellow) phosphor and red phosphor in a polymer binder. Some of the blue light leaks through to combine with the yellow light to create white light, while the red phosphor may create a warmer white light. Any colors can be created. Other wavelength-conversion materials may be used instead, such as quantum dots.

On top of the phosphor layer 28 is deposited a transparent conductor layer 30, such as an indium-tin-oxide (ITO) layer or a layer containing silver nanofibers. The conductor layer 30 may have a conductivity of 1 to 20 ohms/square, which is adequate for short spans with a low current. If the resistivity is too high due to the width of the light sheet, thin metal runners may be printed across the width between two metal busses to create a more uniform voltage across the conductor layer 30.

The LEDs 10 are then printed on the conductor layer 30 such as by screen printing with a suitable mesh to allow the LEDs to pass through and control the thickness of the layer.

Because of the comparatively low concentration, the LEDs 10 will be printed as a monolayer and be fairly uniformly distributed over the substrate 26. Any other suitable deposition process may be used. In the example of FIG. 3, the top anode electrodes 12 are formed to be relatively tall so that the LEDs 10 orient themselves in the direction shown in FIG. 3 by taking the rotational orientation of least resistance when settling on the surface of the conductor layer 30.

The solvent is then evaporated by heat using, for example, an infrared oven. After curing, the LEDs remain attached to the underlying transparent conductor with a small amount of residual resin that was dissolved in the LED ink as a viscosity modifier. The adhesive properties of the resin and the decrease in volume of resin underneath the LED during curing press the bottom LED electrode 14 against the underlying transparent conductor, making ohmic contact with it.

Metal bus bars 32 and 34 are then screen printed along opposite edges of the conductor layer 30 and electrically terminate at a cathode lead for the light sheet. If the bus bar ink is solvent based, it may be cured in an oven. If it is a radiation cured silver, it may be cured by exposing it to a UV light or electron beam curing system. The bus bars will ultimately be connected to a positive or negative driving voltage. Note that metal bus bars 32 and 34 may optionally be printed and cured before printing the bottom transparent conductor 30 or before printing or applying the LEDs 10. Highly conductive materials other than metal may be used for the bus bars.

A dielectric layer 36 is then selectively printed over the lamp surface to encapsulate the LEDs 10 and secure them in position without covering the surrounding bus bars 52. The ink used in the dielectric layer 36 is designed to pull back from the upper surface of the LED 10 during curing to expose the top anode electrodes 12.

A top transparent conductor layer 38 is then printed over the dielectric layer 36 to electrically contact the electrodes 12 and cured in an oven appropriate for the type of transparent conductor being used.

Metal bus bars 40 and 42 are then screen printed along opposite edges of the conductor layer 38 and electrically terminate at an anode lead for the light sheet. The metal bus bars are then cured in a similar manner as used for the bottom bus bars 32 and 34, using a thermal oven or UV curing system, as appropriate for the type of ink used. The points of connection between the bus bars and the driving voltage leads may at points on the top and bottom bus bars at opposite corners of the lamp for uniform current distribution across the lamp or may be at multiple points along each bus bar to reduce the voltage drop across the bus bar to improve electrical efficiency.

A top phosphor layer 44 is then deposited, such as by screen printing, which may be identical to the bottom phosphor layer 28 so that both sides emit the same color.

The resulting structure may be less than 1 mm thick.

If a suitable voltage differential is applied to the anode and cathode leads, all the LEDs 10 will be illuminated. The bidirectional light rays 46 and 48 are combinations of the LED light and the phosphor light.

Since the LEDs 10 do not utilize a large reflector as an electrode, there is no light loss due to reflection losses and LED-absorption losses, adding up to over 10% more optical efficiency than conventional vertical LEDs that emit from one surface only.

As the light sheet width is increased, the voltage differential near the middle of the conductor layers 30 and 38 will be lessened due to the resistivity of the conductor layers. As a result, the middle LEDs 10 may not be as bright as the LEDs nearer the edge.

The configuration of the bus bars in FIGS. 4A and 4B compensates for such resistivity in the conductor layers. Phosphor layers are not shown in FIG. 4A for simplicity and are optional. In FIG. 4A, one metal bus bar 50 is formed along only one edge of the top transparent conductor layer 38, and another metal bus bar 52 is formed along one edge of the bottom transparent conductor layer 30.

FIG. 4B shows how the voltage V1 applied to the bus bar 50 spreads across the top conductor layer 38 and the voltage V2 applied to the bus bar 52 spreads across the bottom conductor layer 30. If we assume the voltage applied to the bus bar 50 is +3V and the voltage applied to the bus bar 52 is −3V, the voltage along the top conductor layer 38 will be reduced to, for example, +2V at the opposite end of the conductor layer 38 due to Ohms law. Similarly, the voltage along the bottom conductor layer 30 will approach ground and be, for example, −2V at the opposite end of the conductor layer 30 due to Ohms law. Along the length of the conductor layers 38/30; however, the differential voltage normal to the layers will be a constant 5 V, sufficient to turn on the LEDs 10, because of the 2 to 3 orders of magnitude lower resistance of the bus bars 50 and 52 relative to the conductor layers 30 and 38 The voltages will be controlled by a current regulator. As long as there is both a much lower resistance in bus bars 50 and 52 relative to the transparent conductor layers 30 and 38 and the transparent conductor layers 30 and 38 have matching impedances, uniform current density and therefore LED brightness can be maintained across the entire surface of the lamp.

FIGS. 5A, 5B, and 5C illustrate another embodiment, where an equal potential is supplied over both conductor layers 38/30 by horizontal metal runners 54/55 (traces) along each of the conductor layers 38/30. Note that the runners 54/55 on the conductor layers 38/30 do not overlie each other, and the runners 54 should be widely spaced from the underlying runners 55 to achieve a substantially constant voltage differential at all points between the conductor layers 38/30. Optionally, a bus bar may be formed along both edges of each conductor layer and connected to the anode or cathode lead, such as shown in FIG. 3, for even more uniform potential in embodiments where the light sheet is large and there are high currents conducted. FIG. 5B is a top down view of the light sheet of FIG. 5A, where FIG. 5A is taken along line 5A-5A in FIG. 5B, and FIG. 5C is a cross-sectional view of the structure of FIG. 5B taken along line 5C-5C.

FIG. 6 illustrates a light sheet using the LEDs 10 from FIG. 1 but the LEDs 10 are arbitrarily oriented during printing so that approximately 50% have their anodes up and 50% have their anodes down. This is accomplished by forming the LEDs 10 to have equal probability fluid dynamics in both orientations, such as by making the anode and cathode electrodes to have similar geometries or other techniques. In another technique, some LEDs in the ink may be formed to have "tall" anode electrodes and other LEDs in the ink may be formed to have "tall" cathode electrodes, where the tall electrodes will generally be facing up after printing due to the rotational forces applied by the solvent as the LEDs are settling to the surface. In this manner, the percentage of the LEDs in each orientation is selectable. The various bus bar arrangements discussed above can be used with FIG. 6.

A DC voltage of a single polarity may be applied to the bus bars to illuminate one orientation of LEDs 10, resulting in bidirectional light. An AC voltage may be applied at greater than 60 Hz (to avoid flicker) to illuminate all the LEDs 10, where each set of LEDs 10 will be illuminate for about half the time. A higher duty cycle, and overall brightness, will be achieved with a square-wave AC driving current.

Figure 7:
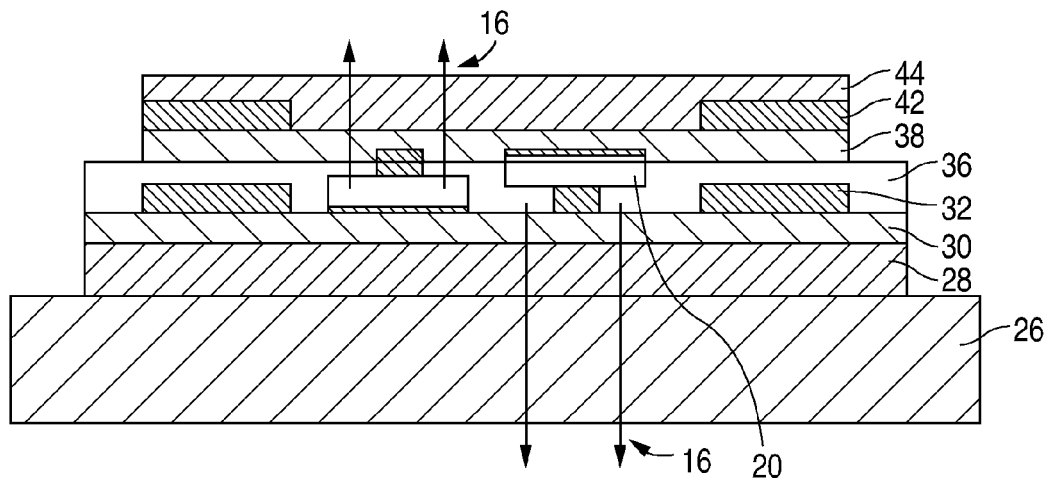
FIG. 7 is a cross-sectional view of a another embodiment of a bidirectional light sheet using the LEDs of FIG. 2, where the LEDs are arbitrarily oriented on the substrate and driven by an AC signal to provide bidirectional emission, or driven to selectively emit from one surface or the other for a particular application.

FIG. 7 illustrates a light sheet using the LEDs 20 from FIG. 2. Otherwise, the light sheet is identical to that of FIG. 6. The various bus bar arrangements discussed above can be used with FIG. 7. The LEDs 20 are uni-directional since they have one surface coated with a reflective electrode. The LEDs 20 are arbitrarily oriented on the substrate 26 so there will be about a 50/50 orientation. An AC driving current is used for the bidirectional emission, with square-wave AC producing the most uniform lighting. If DC is used, one side of the light sheet will be the primary emitter, but some light will scatter and leak out the other side since both sides are substantially transparent. If phosphor layers are included on the lamp surfaces, the phosphor will scatter significant amounts of light out of both lamp surfaces, even if the lamp is powered with a DC voltage.

Figure 8A:
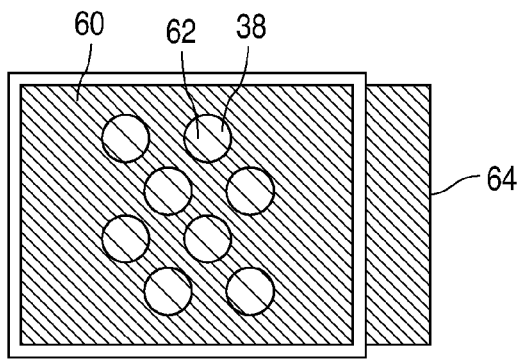
FIGS. 8A and 8B are top down views of metal layers overlying/underlying the transparent conductor layers for uniform voltage spreading, with the relative sizes of the openings greatly exaggerated for simplicity.
Figure 8B:
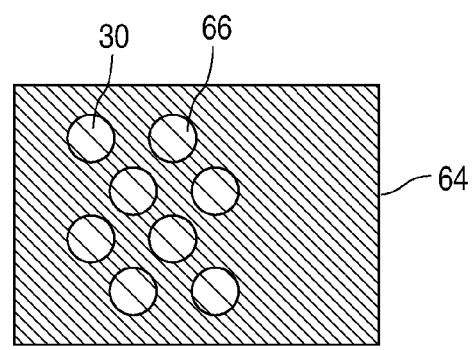

FIGS. 8A and 8B illustrate a metal pattern concept for uniformly distributing the voltage over the entire transparent conductor layer surfaces. The metal layer 60 over the top conductor layer 38 has many openings 62 distributed over it to allow the LED light through. The metal layer 60 can be printed and patterned using screen printing. The same screen pattern is used for printing the LEDs so that no light is blocked by the metal layer 60. Any shape of the openings may be used, such as strips, hexagons, squares, etc. An identical metal layer 64 is printed over the bottom conductor layer 30, with the openings 66 aligned with the openings 62. The metal pattern can be printed so that, for example, 90% of the layer comprises the openings 62/66 and 10% comprises the opaque metal, with only a very thin width of metal between the openings 62/66 to uniformly distribute the voltage. Highly conductive materials other than metal may be used for the layers 60 and 64.

Note that the order of application of layers 30 and 64 can be reversed without affecting the function of the devices. Likewise, the application order of layers 60 and 38 may also be reversed without affecting the function of the lamp. Such print order reversals may be needed to optimize manufacturing processes and curing system function.

By proper construction of the top electrode, over 90% of the LEDs 20 can be oriented with their anodes up to form a uni-directional light sheet. In such a case, the bottom phosphor layer would be deleted, and a thin mirror layer would be deposited on the substrate 26 before printing the lamp, or deposited on top of a completed lamp or laminated on either the top surface of the substrate 26 or the bottom surface of the substrate 26. Such a modification can be made to the light sheets of FIGS. 3-8 so that any downward light is reflected upwards by the mirror layer. Therefore, the light sheets can easily be customized to be uni-directional or bidirectional by changing or adding a few steps in the fabrication process. The mirror layer may even include openings to allow some of the light to pass for aesthetic reasons, such as for illuminating a ceiling.

To maximize optical efficiency, a clear optical stand-off layer, with a thickness roughly equal to or greater than the diameter of an LED, may also be deposited between the lamp and the reflective surface to reduce the amount of reflected light that reenters the LED, 10 or 20 in FIGS. 3-8, where it may be absorbed and lost. If the mirror is applied to the opposite side of a clear substrate 26, the substrate 26 itself acts as this clear optical stand-off.

The substrate 26 may even serve as the reflective layer and may comprise white PET (polyethylene terephthalate), coated white paper or plastic, aluminized PET, etc.

Accordingly, the entire light sheet may be fabricated by printing in atmospheric conditions with simple equipment and without any precision alignment and pick-and-place mechanisms. The light sheet is very flexible without any danger of delamination when flexed and is very thin and light.

The light sheet may be supported by a simple frame and hung from a ceiling or used in other ways. The light sheet can even be bent, such as in a U-shape, a V-shape, or a cylinder, to create two emission patterns, with the inner side focusing the light and the outer side more broadly distributing the light. The light sheet may also be laminated on other surfaces, including windows, or be patterned to create alpha-numeric signs or other displays.

In some applications, the transparency of the light sheet may be important in its off state. If the off-state phosphor color (yellow) of the phosphor layers is offensive, the LEDs may be initially coated with a phosphor prior to printing. In that way, there is much less phosphor area, and the light sheet is more transparent. Alternatively, quantum dots or dyes may be used instead of the yellow phosphor to avoid the yellow off-state color.

One of the phosphor layers may be one type of phosphor or have one characteristic (e.g., thickness or phosphor density) and the other of the phosphor layer may be a different phosphor or have different characteristics. For example, one side of the light sheet may emit light that is bluer than the light emitted from the other side. If the LED are the uni-directional type (such as LEDs 20 in FIG. 7), the polarity of the drive voltage and the relative duty cycles can be controlled to dynamically control the overall color emission. Further, if a reflective layer was laminated on one side of the light sheet, the color of the light emitted from the opposite surface can be controlled using the relative duty cycles of the AC polarity.

A combination of LEDs emitting at different peak wavelengths may be printed, such as by printing closely spaced strips of red, green, and blue LEDs and independently driving each type of LED. The colors will blend, such as to create white light, and the driving currents can be used to dynamically control the color. Therefore, no phosphor layers are used, and the light sheet will be essentially transparent.

Diffusion layers or brightness enhancement layers may be printed on or laminated on the light sheet surfaces to modify the light emission pattern and avoid glare. Similarly, the substrate 26 itself can be designed to have certain optical properties, including being a reflector or containing a wavelength-conversion material to obviate the need for a separate phosphor layer. Different phosphors may be used to cause each side of the light sheet to emit a different color.

The substrate 26 may be provided with a release layer to allow the remaining layers to be removed from the substrate 26, creating a more efficient light sheet having a thickness of only 20-80 microns. Such a light sheet is extremely flexible and even foldable and may be adhered to another type of substrate, including a fabric for clothing.

The light sheets can be used for general illumination, displays, backlights, indicator lights, etc.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. An illumination structure comprising:
    a flexible substrate, the substrate allowing light to pass through;
    a transparent first conductor layer overlying the substrate;
    an array of vertical light emitting diodes (VLEDs) that are printed on the transparent first conductor layer, each of the VLEDs having a bottom electrode electrically contacting the first conductor layer after printing;
    a dielectric material between the VLEDs overlying the first conductor layer, encapsulating sides of the VLEDs;
    a transparent second conductor layer overlying the VLEDs and dielectric layer, each of the VLEDs having a top electrode electrically contacting the second conductor layer;
    a phosphor layer overlying the second conductor layer;
    a first plurality of bus bars in contact with the first conductor layer and embedded in the dielectric material;
    a second plurality of second bus bars in contact with the second conductor layer and directly above the first plurality of bus bars; and
    the VLEDs being illuminated by a voltage differential between the first conductor layer and the second conductor layer such that bidirectional light emitted from each VLED of the array of the VLEDs passes through the first conductor layer and the second conductor layer.

2. The illumination structure of claim 1, wherein the VLEDs comprise:
    a first plurality of VLEDs having their anode electrodes contacting the first conductor layer; and
    a second plurality of VLEDs having their anode electrodes contacting the second conductor layer.

3. The illumination structure of claim 2, wherein the first plurality of VLEDs and the second plurality of VLEDs emit light bidirectionally through their anode side and their cathode side.

4. The illumination structure of claim 2, wherein all the VLEDs are connected in parallel by the first conductor layer and the second conductor layer.

5. The illumination structure of claim 1, wherein greater than 75% of the VLEDs are in the same orientation with respect to the first conductor layer and the second conductor layer.

6. The illumination structure of claim 1, wherein the VLEDs comprise:
    LED semiconductor layers, wherein at least one of the LED semiconductor layers emits light;
    a first surface of the LED semiconductor layers having a first electrode patterned thereon to allow light to exit the first surface; and
    a second surface of the LED semiconductor layers being covered by a reflective second electrode, such that a majority of light emitted by the VLEDs is emitted through the first surface.

7. The illumination structure of claim 6, wherein the VLEDs comprise:
    a first plurality of VLEDs having their anode electrodes contacting the first conductor layer; and
    a second plurality of VLEDs having their anode electrodes contacting the second conductor layer.

8. The illumination structure of claim 7, wherein the second surface covered by the reflective second electrode is a cathode of the VLEDs.

9. The illumination structure of claim 7, wherein the second surface covered by the reflective second electrode is an anode of the VLEDs.

10. The illumination structure of claim 1, wherein each of the VLEDs has a first surface and a second surface, wherein each of the VLEDs includes an anode electrode and a cathode electrode, wherein the anode electrode covers less than 50% of an area of the first surface and wherein the cathode electrode covers less than 50% of an area of the second surface.

11. The illumination structure of claim 1, wherein there is only a single substrate in the structure.

12. The illumination structure of claim 1 further comprising conductive first runners extending between adjacent ones of the first plurality of bus bars and electrically contacting the first conductor layer, and conductive second runners extending between adjacent ones of the second plurality of second bus bars and electrically contacting the second conductor layer.

13. The illumination structure of claim 1 further comprising a first wavelength-conversion layer underlying the first conductor layer.

14. The illumination structure of claim 1, wherein the structure is flexible and less than 1 mm in thickness.

15. The illumination structure of claim 1, wherein the VLEDs are microscopic VLEDs printed as an ink over the first conductor layer.

* * * * *